United States Patent
Jain et al.

(10) Patent No.: US 10,014,397 B1
(45) Date of Patent: Jul. 3, 2018

(54) BIPOLAR JUNCTION TRANSISTORS WITH A COMBINED VERTICAL-LATERAL ARCHITECTURE

(71) Applicant: GLOBALFOUNDRIES Inc., Grand Cayman (KY)

(72) Inventors: Vibhor Jain, Essex Junction, VT (US); Qizhi Liu, Essex Junction, VT (US); David L. Harame, Essex Junction, VT (US); Renata Camillo-Castillo, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/383,171

(22) Filed: Dec. 19, 2016

(51) Int. Cl.
| | |
|---|---|
| *H01L 29/737* | (2006.01) |
| *H01L 29/06* | (2006.01) |
| *H01L 29/66* | (2006.01) |
| *H01L 29/165* | (2006.01) |
| *H01L 29/417* | (2006.01) |
| *H01L 21/265* | (2006.01) |
| *H01L 29/735* | (2006.01) |
| *H01L 27/12* | (2006.01) |

(52) U.S. Cl.
CPC ...... *H01L 29/737* (2013.01); *H01L 21/26513* (2013.01); *H01L 27/1203* (2013.01); *H01L 29/0653* (2013.01); *H01L 29/165* (2013.01); *H01L 29/41708* (2013.01); *H01L 29/66242* (2013.01); *H01L 29/735* (2013.01)

(58) Field of Classification Search
CPC ............ H01L 29/735; H01L 29/26513; H01L 29/165; H01L 29/66242; H01L 29/0653; H01L 29/41708; H01L 29/737
See application file for complete search history.

(56) References Cited

U.S. PATENT DOCUMENTS

| | | | |
|---|---|---|---|
| 5,073,506 A | 12/1991 | Maszara et al. | |
| 5,298,786 A | 3/1994 | Shahidi et al. | |
| 6,949,764 B2 | 9/2005 | Ning | |
| 8,288,758 B2 | 10/2012 | Ning et al. | |
| 8,441,084 B2 | 5/2013 | Cai et al. | |
| 8,586,441 B1 | 11/2013 | Cai et al. | |
| 9,318,585 B1 | 4/2016 | Cai et al. | |
| 2004/0198039 A1* | 10/2004 | Goller | H01L 21/76802 438/637 |
| 2007/0007625 A1* | 1/2007 | Khater | H01L 29/1004 257/565 |
| 2009/0179228 A1* | 7/2009 | Joseph | H01L 29/0817 257/197 |

(Continued)

*Primary Examiner* — Benjamin Sandvik
*Assistant Examiner* — Farid Khan
(74) *Attorney, Agent, or Firm* — Thompson Hine LLP; Anthony Canale

(57) ABSTRACT

Device structures and fabrication methods for a bipolar junction transistor. The device structure includes an intrinsic base, an emitter having a vertical arrangement relative to the intrinsic base, and a collector having a lateral arrangement relative to the intrinsic base. The device structure may be fabricated by forming the intrinsic base and the collector in a semiconductor layer, and epitaxially growing the emitter on the intrinsic base and with a vertical arrangement relative to the intrinsic base. The collector and the intrinsic base have a lateral arrangement within the semiconductor layer.

16 Claims, 8 Drawing Sheets

(56) References Cited

U.S. PATENT DOCUMENTS

| | | | |
|---|---|---|---|
| 2012/0139009 A1* | 6/2012 | Ning | H01L 29/0808 257/197 |
| 2013/0082353 A1* | 4/2013 | Kuo | H01L 27/0259 257/591 |
| 2016/0027905 A1* | 1/2016 | Singh | H01L 29/7393 257/139 |
| 2016/0093622 A1* | 3/2016 | Luan | H01L 29/742 257/133 |

* cited by examiner

US 10,014,397 B1

BIPOLAR JUNCTION TRANSISTORS WITH A COMBINED VERTICAL-LATERAL ARCHITECTURE

BACKGROUND

The invention relates generally to semiconductor devices and integrated circuit fabrication and, in particular, to fabrication methods and device structures for bipolar junction transistors and heterojunction bipolar transistors.

Bipolar junction transistors may be found, among other end uses, in radiofrequency transceivers, multi-gigabit analog-to-digital converters, optical communication, automotive radar, and high-speed circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types on the same chip.

Bipolar junction transistors are three-terminal electronic devices that include an emitter, an intrinsic base, and a collector arranged such that the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

A heterojunction bipolar transistor (HBT) is a type of bipolar junction transistor in which two or more of the emitter, intrinsic base, and/or collector are composed of semiconductor materials with unequal band gaps, which creates heterojunctions instead of homojunctions. For example, the collector and/or emitter of a heterojunction bipolar transistor may be composed of silicon, and the base of a heterojunction bipolar transistor may be composed of silicon germanium (SiGe), which is characterized by a narrower band gap than silicon. In wireless designs for radiofrequency applications, the interfaces between the antenna and the electronic circuits are provided by a low-noise amplifier (LNA) and a power amplifier (PA), each of which may include a heterojunction bipolar transistor with a SiGe base.

Improved fabrication methods and device structures are needed for bipolar junction transistors and heterojunction bipolar transistors.

SUMMARY

In an embodiment of the invention, a device structure for a bipolar junction transistor includes an intrinsic base, an emitter having a vertical arrangement relative to the intrinsic base, and a collector having a lateral arrangement relative to the intrinsic base.

In an embodiment of the invention, a method is provided for forming a device structure for a bipolar junction transistor. The method includes forming an intrinsic base and a collector in a semiconductor layer, and epitaxially growing an emitter on the intrinsic base and with a vertical arrangement relative to the intrinsic base. The collector and the intrinsic base have a lateral arrangement within the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
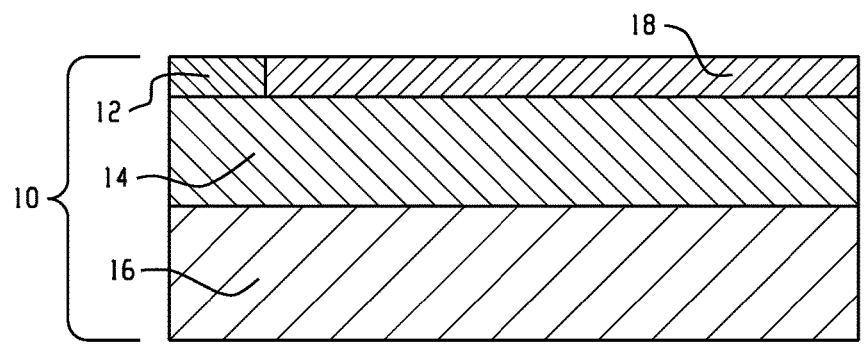
FIGS. 1-7 are cross-sectional views of a portion of a substrate at successive fabrication stages of a processing method for fabricating a device structure in accordance with embodiments of the invention.

With reference to FIG. 1 and in accordance with an embodiment of the invention, a substrate 10 in the representative form of a semiconductor-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. The BOX layer 14 has a surface in direct contact with the handle wafer 16 along an interface and another surface in direct contact with the device layer 12 along another interface, and these surfaces are separated by the thickness of the BOX layer 14 that terminates at the rim of the substrate 10. The device layer 12 is electrically isolated from the handle wafer 16 by the BOX layer 14. The handle wafer 16 may be lightly doped to have, for example, p-type conductivity. The front side of the substrate 10 including the device layer 12 may be considered to be an active device side of the substrate 10.

An active device region 18 of the device layer 12 may be modified in its composition through the addition of germanium using, for example, thermal condensation. The active device region 18 of device layer 12 extends from the top surface of the device layer 12 to the top surface of the BOX layer 14. Thermal condensation involves growing an epitaxial silicon-germanium (SiGe) layer grown on the active device region 18 of the device layer 12 and executing a thermal process that causes germanium atoms to be irreversibly transported (e.g., diffuse) from the SiGe layer into the semiconductor material (e.g., silicon) of the device layer 12 during oxidation. The BOX layer 14 represents a barrier to germanium diffusion. The epitaxial silicon-germanium layer is converted to an oxide depleted of germanium (e.g., silicon dioxide ($SiO_2$)), and the active device region 18 of the device layer 12 receiving the germanium is converted to a germanium-enriched semiconductor material (e.g., SiGe). The active device region 18 retains the single crystal state of the initial semiconductor material from which the device layer 12 is composed. Thermal condensation may be performed by rapid thermal oxidation with the substrate 10 placed in an oxygen-containing ambient inside a rapid thermal annealing tool. Following the thermal process, the oxidized remainder layer may be selectively removed, such as by etching, for example, using a dilute hydrofluoric acid (HF).

The modification to the active device region 18 may be performed in conjunction with a thermal condensation associated with a process forming channel SiGe for p-type field-effect transistors being fabricated in a different area of the SOI substrate 10 with complementary metal-oxide-semiconductor (CMOS) processes. In an alternative embodiment, the active device region 18 of the device layer 12 may be not be modified in its composition and may retain the initial composition of the device layer 12, such as silicon that is single crystal.

Figure 2:
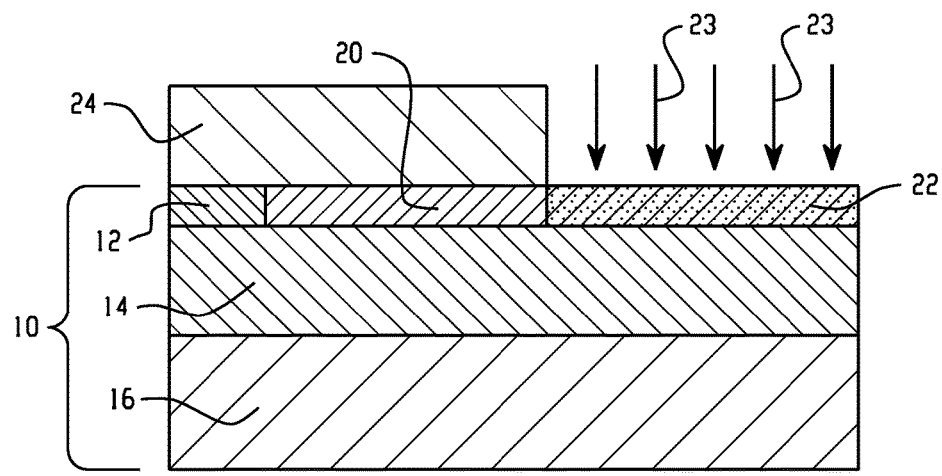

With reference to FIG. 2 in which like reference numerals refer to like features in FIG. 1 and at a subsequent fabrication stage, a section 22 of the active device region 18 is doped by introducing a dopant using, for example, ions 23 implanted with given implantation conditions (e.g., ion dose and kinetic energy). A patterned implantation mask 24 may be used to define the area of the active device region 18 that receives a dose of the ions 23 during implantation to form the section 22. A section 20 of the active device region 18, which is masked by the implantation mask 24, does not receive a dose of the ions 23. The sections 20, 22 of the active device region 18, which is itself a section of the device layer 12, may be vertically arranged to have a contacting relationship with the BOX layer 14 and the contacting relationship may constitute direct contact. Section 20 of the active device region 18 and section 22 of the active device region 18 have a lateral arrangement within the device layer 12 and active device region 18, and the sections 20, 22 may directly contact each other in the lateral arrangement along a vertical junction.

The implantation mask 24 may be comprised of a layer of a light-sensitive material, such as an organic photoresist, that may be applied as a fluid by a spin coating process, pre-baked, exposed to light projected through a photomask, baked after exposure, and developed with a chemical developer, and is stripped after implantation. A p-type dopant (e.g., boron (B)) effective to impart p-type conductivity may be introduced into the semiconductor material of the section 22 of the active device region 18. The implantation mask 24 is stripped from section 20 of the active device region 18 after the section 22 is implanted.

In an embodiment, the doping of the section 22 may be performed as part of a process forming field-effect transistors in a different area of the SOI substrate 10 outside of the active device region 18. In particular, implantation of ions 23 and the implantation mask 24 may be shared with the ion implantation and implantation mask for a process stage fabricating the field-effect transistors, and the need for a separate implantation and mask avoided.

The section 22 of active device region 18 receiving the dopant forms an intrinsic base of a device structure for a bipolar junction transistor, and contains lightly-doped semiconductor material through a selection of implantation conditions. Section 20 of the active device region 18, which is undoped by the implantation and adjacent to section 22, forms a collector of the device structure for the bipolar junction transistor. In an alternative embodiment, the condensation process may be omitted such that both of the sections 20, 22 of the active device region 18 are comprised of the material (e.g., silicon) of the device layer 12. In an alternative embodiment, the section 20 of the active device region 18 may be lightly doped with an n-type dopant (e.g., phosphorus (P) or arsenic (As)) effective to impart n-type conductivity. The section 22 of active device region 18 may be masked by an implantation mask to prevent counter-doping when section 20 is implanted.

Figure 3:
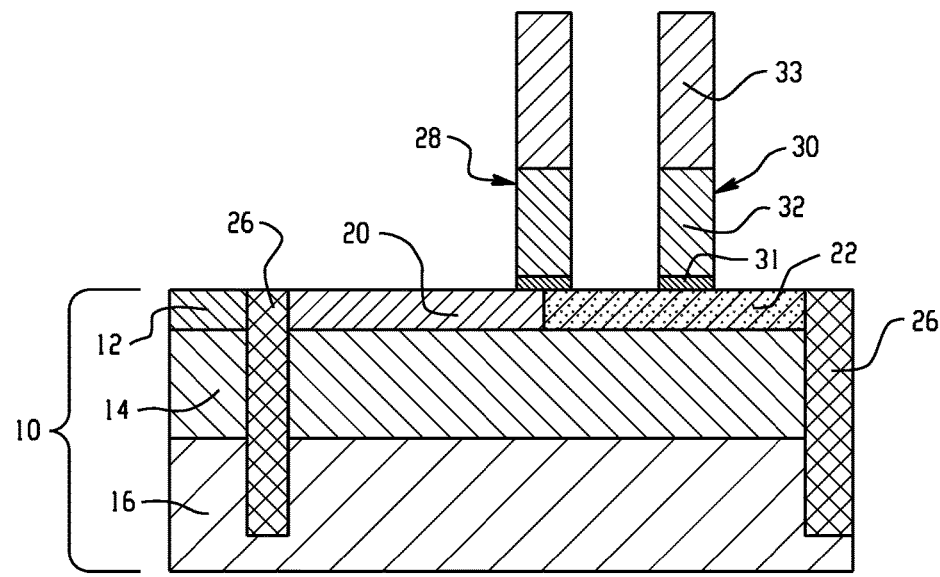

With reference to FIG. 3 in which like reference numerals refer to like features in FIG. 2 and at a subsequent fabrication stage, a trench isolation region 26 is formed in the device layer 12. The trench isolation region 26 surrounds the active device region 18 of device layer 12 and defines the size, geometrical shape, and outer boundary for the active device region 18. The trench isolation region 26 is located in trenches penetrating vertically through the device layer 12 and BOX layer 14, and to a shallow depth into the handle wafer 16. The trench isolation region 26 may be formed by a shallow trench isolation (STI) technique that relies on lithography and dry etching processes to define the trenches, deposits an electrical insulator to fill the trenches, and planarizes the electrical insulator relative to the top surface of the device layer 12 using, for example, chemical mechanical polishing (CMP). The trench isolation region 26 may be comprised of a dielectric material, such as a silicon dioxide (e.g., $SiO_2$), deposited by CVD. The trench isolation regions 26 may also comprise deep trench isolation.

Gate structures 28, 30 are formed in a spaced lateral arrangement on a top surface of the active device region 18. Each of the gate structures 28, 30 includes a gate dielectric 31, a gate electrode 32, and a dielectric cap 33 arranged in a vertical layer stack. Gate structure 28 overlaps the section 22 of the active device region 18 and the adjacent section 20 of the active device region 18, and is aligned vertically with the vertical junction that is defined along the intersection between the sections 20, 22 of the active device region 18. The space between the gate structure 28 and the gate structure 30 has a gap dimension D. The gate dielectrics 31 may be comprised of an electrical insulator, such as silicon dioxide ($SiO_2$) or a high-K dielectric material depending on the CMOS technology, the gate electrodes 32 may be comprised of a conductor, such as polycrystalline silicon (polysilicon), and the dielectric cap 33 may be comprised of an electrical insulator, such as silicon nitride ($Si_3N_4$).

The gate structures 28, 30 may be formed by patterning a layer stack of their constituent materials with photolithography and etching as part of a process forming field-effect transistors in a different area of the SOI substrate 10. The gate structures 28, 30 are dummy gates that are not subsequently contacted by middle-of-line or back-end-of-line wiring. As a consequence, the gate structures 28, 30 may be formed with a spacing that does not need to comply with a minimum pitch for interconnect contacts.

The gate structures 28, 30 may be formed in conjunction with the formation of similar gate structures associated with the fabrication of field-effect transistors in a different area on the SOI substrate 10 outside of the active device region 18.

Figure 4:
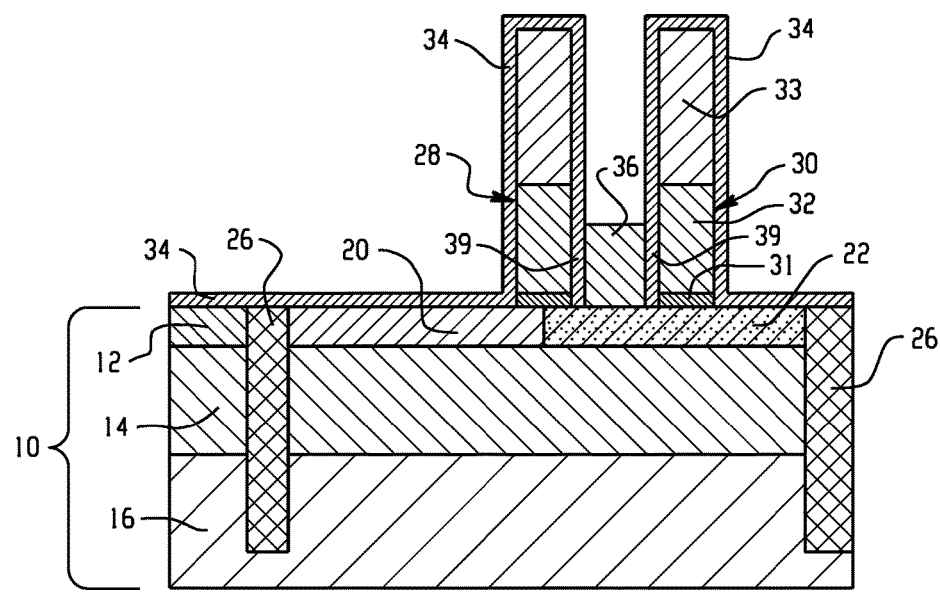

With reference to FIG. 4 in which like reference numerals refer to like features in FIG. 3 and at a subsequent fabrication stage, a conformal layer 34 comprised of a dielectric material, such as silicon nitride ($Si_3N_4$) deposited by CVD, on the active device region 18 and across the gate structures 28, 30. A section of the conformal layer 34 is removed from the top surface of the active device region 18 in the gap laterally between the gate structure 28 and the gate structure 30. An etch mask (not shown) may be applied with an opening that coincides with the space between the gate structure 28 and the gate structure 30, and an etching process, such as RIE, may be used to remove a section of the conformal layer 34 from the space between the gate structure 28 and the gate structure 30.

An emitter 36 is formed as a semiconductor layer on the surface of the active device region 18 in the space between the gate structure 28 and the gate structure 30, and on the section 22 of the active device region 18 exposed when the section of the conformal layer 34 is removed. The emitter 36, which is coupled with the section 22 of the active device region 18, has a vertical arrangement relative to the section 22 and may be in direct contact with section 22. The emitter 36 may be comprised of a single-crystal semiconductor material, such as silicon, grown by an epitaxial growth process. In an embodiment, the emitter 36 may be formed by a selective epitaxial growth (SEG) process in which semiconductor material nucleates for epitaxial growth on semiconductor surfaces, but does not nucleate for epitaxial growth from insulator surfaces. The conformal layer 34 covers the top surface of the active device region, except where opened, with such an insulator surface during the formation of the emitter 36. The emitter 36 may be either undoped or lightly doped in situ during growth with, for example, an n-type dopant (e.g., phosphorus (P) or arsenic (As)) effective to impart n-type conductivity. As a result, the emitter 36 may be used to tailor dopant diffusion and limit base pinch-off.

Spacers 39 comprised of material of the conformal layer 34 are located between the gate structures 28, 30 and the emitter 36. The gap dimension D of the space between the gate structure 28 and the gate structure 30 is reduced by a sum of the thickness of the spacer 39 on the gate structure 28 and a thickness of the spacer 39 on the gate structure 30. The gate structures 28, 30 may function to self-align the semiconductor material of the emitter 36 relative to the section 22 of the active device region 18 during epitaxial growth, and to promote vertical epitaxial growth. The emitter 36 is laterally arranged in the space between gate structure 28 and gate structure 30, and grows vertically due to the lateral constraint of the growth front by the gate structures 28, 30.

Figure 5:
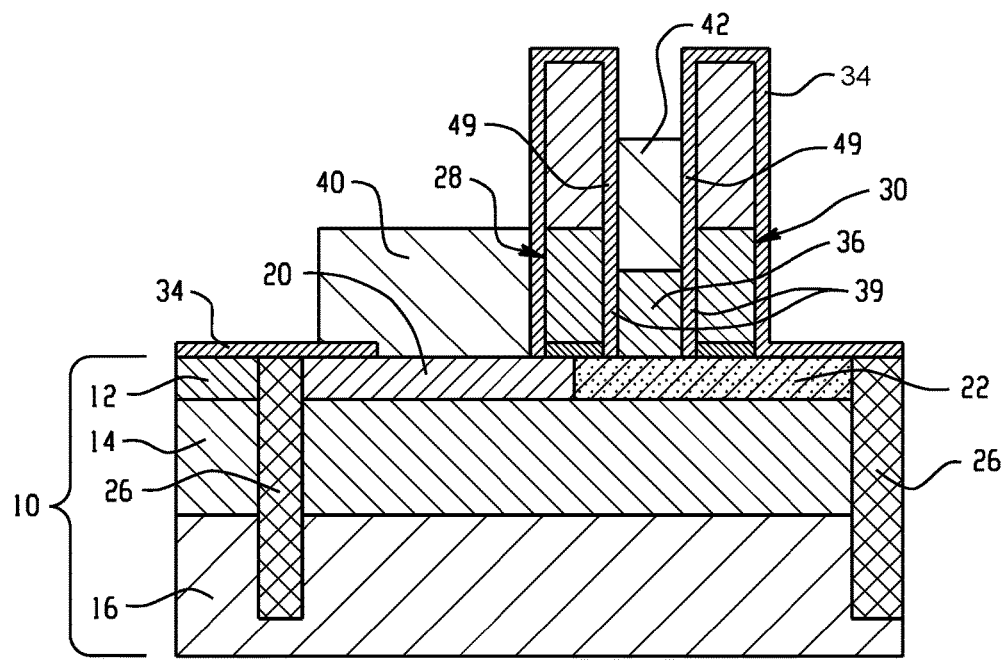

With reference to FIG. 5 in which like reference numerals refer to like features in FIG. 4 and at a subsequent fabrication stage, a section of the conformal layer 34 is removed from the top surface of the active device region 18 located adjacent to the gate structure 28. A patterned etch mask (not shown) may be applied and an etching process, such as RIE, may be used to remove the section of the conformal layer 34 at the targeted location.

An emitter contact 42 is formed on a top surface of the emitter 36 and a collector contact 40 is formed at the targeted location at which the conformal layer 34 has been opened to the active device region 18. The collector contact 40 and the emitter contact 42 are sections of a semiconductor layer. The emitter contact 42 is located laterally in the space between the gate structure 28 and the gate structure 30. The collector contact 40 is formed on the top surface of the section 20 of active device region 18 laterally adjacent to the gate structure 28 with the gate structure 28 disposed laterally between the collector contact 40 and the emitter contact 42, and also disposed laterally between the collector contact 40 and the emitter 36. The emitter contact 42 and collector contact 40 are elevated or raised relative to the top surface of the active device region 18 with the emitter contact 42 as a different elevation (i.e. height) than the collector contact 40 due to the prior formation of emitter 36 in the space between the gate structure 28 and the gate structure 30.

The emitter contact 42 and collector contact 40 may be formed using an epitaxial growth process to deposit sections of an epitaxial layer of a semiconductor material, such as silicon (Si). The gate structures 28, 30 may function to laterally constrain the vertical epitaxial growth of the semiconductor material of the emitter contact 42 and collector contact 40. In an embodiment, the emitter contact 42 and collector contact 40 may be formed by a selective epitaxial growth (SEG) process in which semiconductor material nucleates for epitaxial growth on semiconductor surfaces, but does not nucleate for epitaxial growth from insulator surfaces. The semiconductor material constituting the collector contact 40 and emitter contact 42 may include in situ doping during growth to impart a given conductivity type to the grown semiconductor material. In an embodiment, the semiconductor material of the emitter contact 42 and collector contact 40 may comprise an n-type dopant from Group V of the Periodic Table (e.g., phosphorus (P) or arsenic (As)) that is effective to impart n-type conductivity.

Figure 5A:
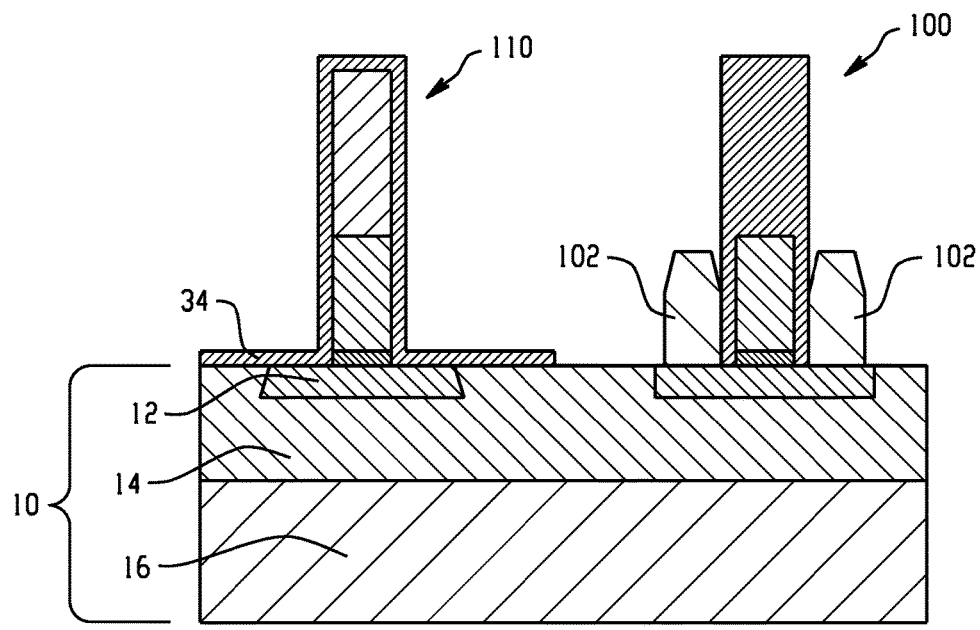
FIG. 5A is a cross-sectional view of device structures being fabricated on a different area of the substrate in parallel with the fabrication of the device structure of FIG. 5.

The conformal layer 34 may be patterned to open locations in the conformal layer 34 for the epitaxial growth of n+ source/drain regions 102 associated with the fabrication of n-type field-effect transistors 100 in a different area on the SOI substrate 10 that is outside of the active device region 18, as shown in FIG. 5A. The patterning of the conformal layer 34 may use the same patterned etch mask used to open the conformal layer 34 for the growth of the collector contact 40 and emitter contact 42. During epitaxial growth, the conformal layer 34 functions as a protection layer with an insulator surface covering the partially formed p-type field-effect transistors 110. The emitter contact 42 and collector contact 40 may be formed by a deposition process shared with the epitaxial growth of n+ source/drain regions 102 for the n-type field-effect transistors 100.

Spacers 49 comprised of material of the conformal layer 34 are located between the sidewall of the gate structure 28 and the collector contact 40 and between the gate structures 28, 30 and the emitter contact 42. The emitter contact 42 is vertically separated from the active device region 18 because of the intervening presence of the emitter 36, and the emitter contact 42 and the collector contact 40 are therefore at different elevations relative to the top surface of the active device region 18 and a plane containing the top surface of the section 20 of the active device region 18. The collector contact 40 is closer to the top surface of the active device region 18 than the emitter contact 42. The conformal layer 34 is removed from the horizontal surfaces of the active device region 18 with a reactive ion etch (RIE) process following the formation of the emitter contact 42 and collector contact 40.

Figure 6:
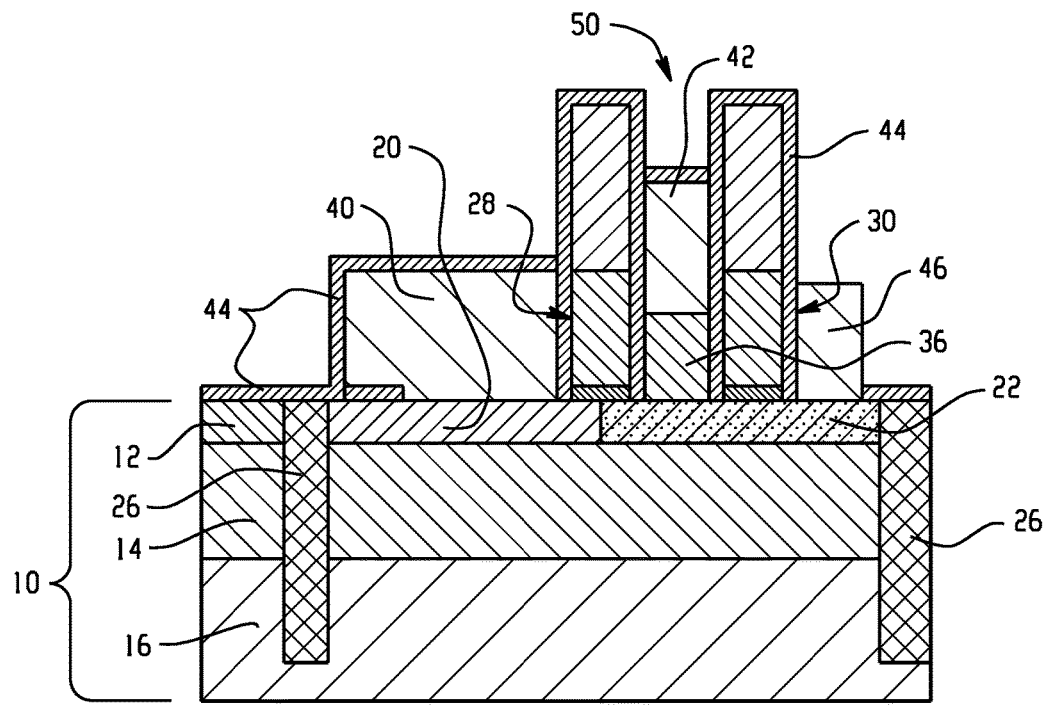

With reference to FIG. 6 in which like reference numerals refer to like features in FIG. 5 and at a subsequent fabrication stage, a conformal layer 44 comprised of a dielectric material, such as silicon nitride ($Si_3N_4$) deposited by CVD, on the active device region 18 and across the gate structures 28, 30, emitter contact 42, and collector contact 40. A section of the conformal layer 44 is removed from the top surface of the active device region 18 adjacent to the gate structure 30 and on the opposite side of the gate structure 30 from the emitter 36. A patterned etch mask (not shown) may be applied, and an etching process, such as RIE, may be used to selectively remove the section of the conformal layer 44 at the targeted location.

A base contact 46 is formed on the surface of the section 22 of active device region 18 adjacent to the gate structure 30 at the targeted location opened in the conformal layer 44. The base contact 46 may be formed using an epitaxial growth process to deposit a layer of a semiconductor material, such as silicon-germanium (SiGe). The gate structure 30 may function to self-align the semiconductor material of the base contact 46 during epitaxial growth, and to promote vertical epitaxial growth through lateral constraint. A spacer 39 comprised of material of the conformal layer 34 and/or the conformal layer 44 is located between the sidewall of the gate structure 30 and the base contact 46. The emitter 36 may be laterally arranged between the base contact 46 and the collector contact 40, and laterally arranged between the base contact 46 and the section 22 of the active device region 18.

The base contact 46 may be formed by a selective epitaxial growth (SEG) process in which semiconductor material nucleates for epitaxial growth on semiconductor surfaces, but does not nucleate for epitaxial growth from insulator surfaces. The conformal layer 44 covers the emitter contact 42 and collector contact 40 with such an insulator surface during the formation of the base contact 46. The semiconductor material constituting the base contact 46 may include in situ doping during growth to impart a given conductivity type to the grown semiconductor material. In an embodiment, the semiconductor material of the base contact 46 may comprise a p-type dopant selected from Group III of the Periodic Table (e.g., boron (B)) that is effective to impart p-type conductivity.

The base contact 46, which may be heavily doped, may define an extrinsic base of the device structure for the bipolar junction transistor that is coupled with the section 22 functioning as the intrinsic base. The conductivity type of the semiconductor material constituting base contact 46 is opposite to the conductivity type of the semiconductor materials constituting the emitter contact 42 and collector contact 40. The conformal layer 44 is removed following the formation of the base contact 46.

Figure 6A:
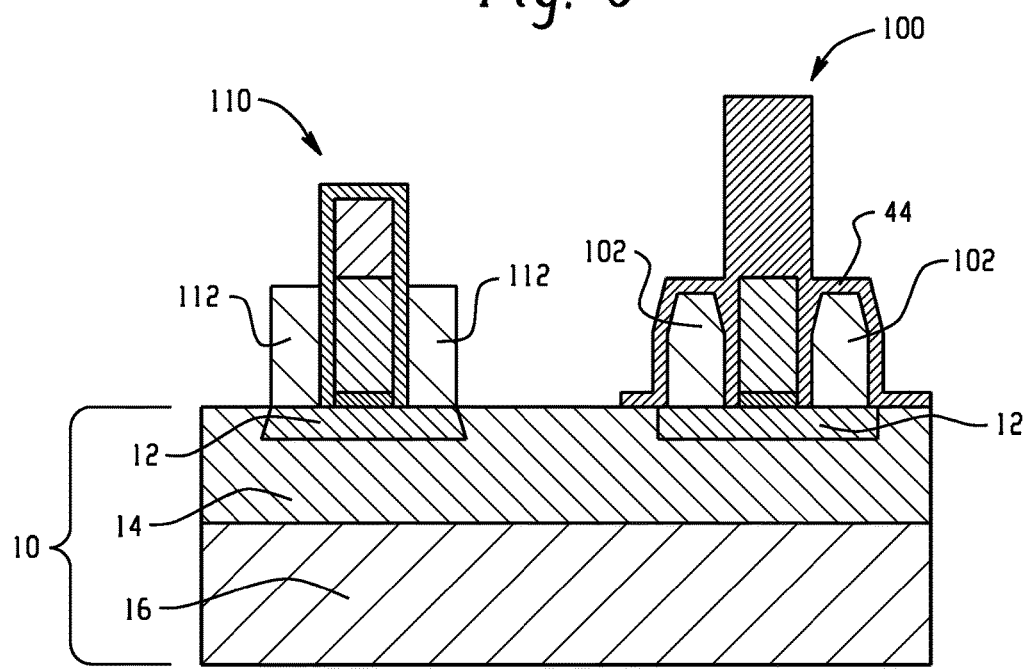
FIG. 6A is a cross-sectional view similar to FIG. 5A of device structures being fabricated on the different area of the substrate in parallel with the fabrication of the device structure of FIG. 6.

The conformal layer 44 opened to form the base contact 46 may also be used to open locations in the conformal layer 44 for the epitaxial growth of p+ source/drain regions 112 associated with the fabrication of p-type field-effect transistors 110 in a different area on the SOI substrate 10, as shown in FIG. 6A. The patterning of the conformal layer 44 may use the same patterned etch mask used to open the conformal layer 44 for the growth of the base contact 46. The conformal layer 44 functions as a protection layer with an insulator surface covering the partially-completed n-type field-effect transistors 100. The base contact 46 may also be formed by a shared deposition process in conjunction with the epitaxial growth of p+ source/drain regions 112 of the p-type field-effect transistors 110.

The device structure for the bipolar junction transistor 50 includes the sections 20, 22 of the active device region 18, the emitter 36, the emitter contact 42, the collector contact 40, and the base contact 46. Section 22 of the active device region 18 may function as the intrinsic base of the bipolar junction transistor 50. The base contact 46 may function as the extrinsic base of the bipolar junction transistor 50 and is used to contact the intrinsic base defined by section 22 of the active device region 18. The section 20 of the active device region 18 may function as the collector of the bipolar junction transistor 50. Dopant may diffuse from the emitter contact 42 into the emitter 36 and from the collector contact 40 into the section 20 of the active device region 18 during thermal processes. The emitter 36 may operate to control vertical diffusion of dopant from the emitter contact 42 into the underlying section 22 of the active device region 18 with which the emitter 36 is coupled.

The conductivity type of the semiconductor material constituting the section 22 of the active device region 18 and the base contact 46 is opposite to the conductivity type of the semiconductor material constituting the emitter 36 and the emitter contact 42. The conductivity type of the semiconductor material constituting the section 22 of the active device region 18 is opposite to the conductivity type of the semiconductor material constituting the section 20 of the active device region and the collector contact 40. The bipolar junction transistor 50 may be characterized as a heterojunction bipolar transistor (HBT) if the sections 20, 22 of the active device region 18 are modified by thermal condensation to have a different composition than the emitter 36 and collector contact 40.

Figure 7:
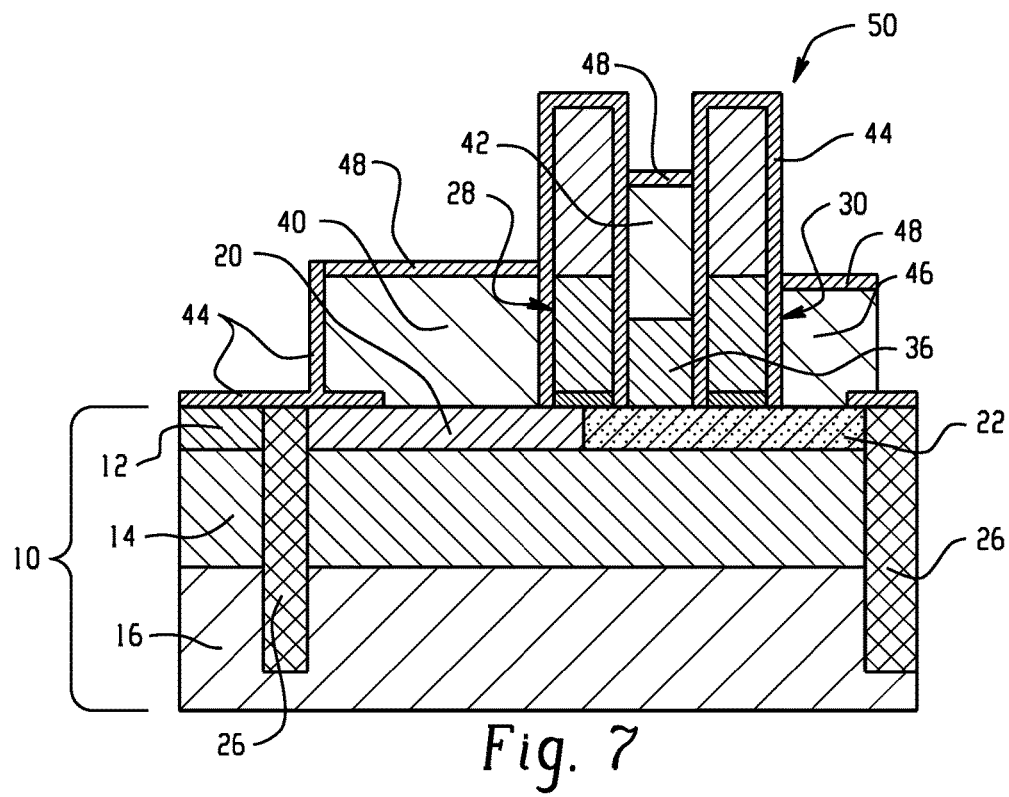

With reference to FIG. 7 in which like reference numerals refer to like features in FIG. 6 and at a subsequent fabrication stage, after the bipolar junction transistor 50 is formed, silicidation and middle-of-line (MOL) and back-end-of-line (BEOL) processing follows, which includes formation of contacts and wiring for the local interconnect structure overlying the device structure, and formation of dielectric layers, via plugs, and wiring for an interconnect structure coupled by the interconnect wiring with the device structure as well as other similar contacts for additional device structures like the bipolar junction transistor 50 and field-effect transistors 100, 110 (FIG. 6A) included in other circuitry fabricated on the SOI substrate 10. In particular, sections of a silicide layer 48 may be formed on the collector contact 40, the emitter contact 42, and the base contact 46 after the conformal layer 44 is opened to expose the respective top surfaces of the collector contact 40 and emitter contact 42.

The gate structure 30, which is non-contacted by the MOL/BEOL interconnect structure in the final device construction, isolates the base contact 46 from the emitter 36 and emitter contact 42. The gate structure 28, which is also non-contacted by the MOL/BEOL interconnect structure in the final device construction, isolates the collector contact 40 from the emitter 36 and emitter contact 42.

The lateral spacing between the collector contact 40 and the stack including the emitter 36 and emitter contact 42 may be a factor in the determination of the transit delay and breakdown voltage. The lateral spacing between the collector contact 40 and the stack including the emitter 36 and emitter contact 42 is a given distance that may be correlated with the gate length of the gate structure 28. If the spacers 39 are considered, the lateral spacing may be equal to a sum of the gate length, L, of the gate structure 28 and the widths of the spacers 39 cladding the opposite vertical sidewalls of the gate structure 28. The gate length may be selected to establish a predetermined breakdown voltage for the device structure of the bipolar junction transistor 50 based on the resultant distance of lateral spacing of the emitter contact 42 and the collector contact 40. To increase the breakdown voltage, a longer gate length can be used or multiple gate structures can be inserted to separate the collector contact 40 from the emitter contact 42.

The spacing between the base contact 46 and the emitter contact 42 is a factor that determines the base resistance, which factors into the values for maximum oscillation frequency fmax and noise figure. The spacing between the base contact 46 and the emitter contact 42 is determined by the gate length of the gate structure 30 and the widths of the spacers 39 cladding the sidewalls of the gate structure 30. Dimensions for the gate lengths and spacer widths may be selected in order to tailor these performance metrics of the bipolar junction transistor 50.

The section 22 of active device region 18 functioning as the intrinsic base of the device structure for the bipolar junction transistor 50, and the section 20 of the active device region 18 functioning as the collector of the device structure for the bipolar junction transistor 50 are located laterally adjacent to each other. During operation of the bipolar junction transistor 50, the current flow of majority carriers occurs laterally between the sections 20, 22 of the device structure. The emitter 36 of the device structure for the bipolar junction transistor 50 is located vertically above the section 22 of active device region 18 functioning as the intrinsic base. During operation, the current flow of majority carriers occurs vertically between emitter 36 and the collector formed by the section 22 of the active device region 18.

The base contact 46 is laterally arranged on one side of the emitter 36 and the collector contact 40 is laterally arranged on an opposite side of the emitter 36 in a collector-emitter-base (CEB) arrangement. The breakdown voltage of the device structure for the bipolar junction transistor 50 may be tuned by changing the distance between the emitter contact 42 and the collector contact 40 through selection of gate length and spacer thickness. Due to the intervening presence of the emitter 36, the emitter contact 42 is elevated at a different height relative to the top surface of the active device region 18 than the collector contact 40. Non-contacted gate structures 28, 30 separate the collector contact 40, the emitter contact 42, and the base contact 46 with defined separation distances, and prevent the overgrowth of epitaxial semiconductor material over adjacent surfaces of dielectric layers when the collector contact 40, the emitter contact 42, and the base contact 46 are formed. The sections 20, 22 of the device structure respectively constituting the intrinsic base and collector may be in a contacting relationship with the BOX layer 14 for operation of the bipolar junction transistor 50 with full depletion.

The formation of the bipolar junction transistor 50 can be seamlessly integrated into a CMOS process flow forming field-effect transistors 100, 110. In particular, the only additional mask that may be required is the mask used to open locations in the conformal layer 34 for epitaxial growth of the emitter 36 and, in some embodiments as described below in the context of FIG. 9, the simultaneous growth of the collector contact 40. In some embodiments, another additional mask may be needed to form the section 22 of active device region 18.

In an alternative embodiment, the device structure may be expanded to include multiple emitter fingers like the emitter finger defined by emitter 36 and emitter contact 42. Additional gate structures may be added and epitaxial growth used to form an additional emitter finger and an additional collector contact in a collector-emitter-base-emitter-collector (CEBEC) arrangement.

Figure 8:
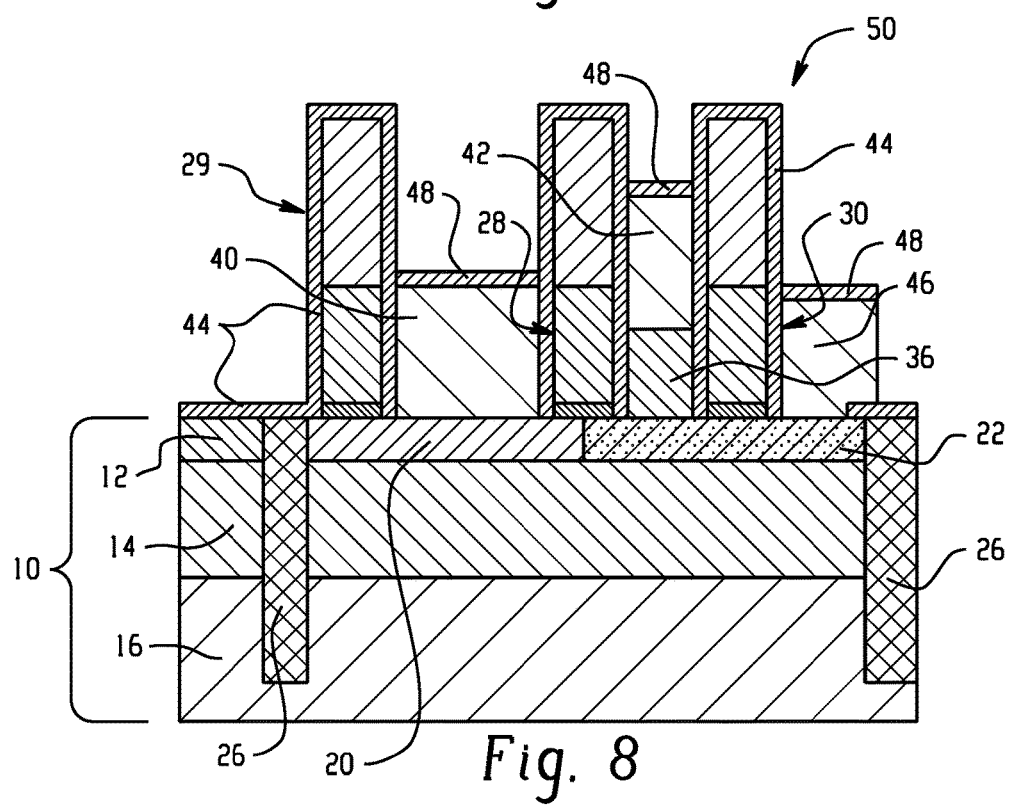
FIG. 8 is a cross-sectional view similar to FIG. 7 of a device structure fabricated by a processing method in accordance with embodiments of the invention.

With reference to FIG. 8 in which like reference numerals refer to like features in FIG. 7 and in accordance with an alternative embodiment, the emitter 36, emitter contact 42, collector contact 40, and base contact 46 may be formed with the assistance of another gate structure 29 in addition to the gate structures 28, 30. The collector contact 40 is formed in a space between the gate structure 28 and the gate structure 29. The epitaxial growth of the collector contact 40 is constrained by the gate structures 28, 29 and the growth front moves vertically without lateral overgrowth over a dielectric layer.

Figure 9:
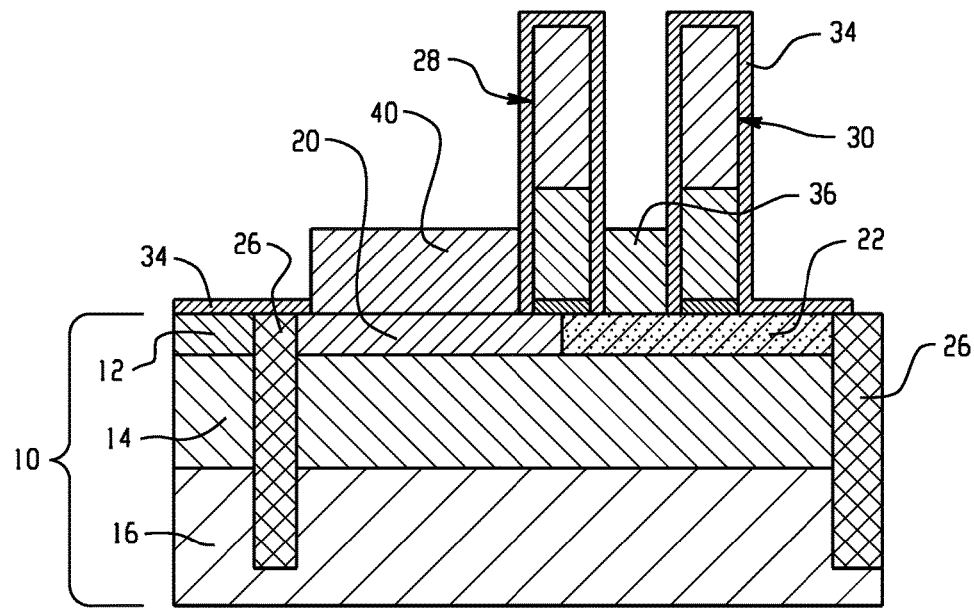
FIG. 9 is a cross-sectional view similar to FIG. 4 of a device structure fabricated by a processing method in accordance with embodiments of the invention.

With reference to FIG. 9 in which like reference numerals refer to like features in FIG. 4 and in accordance with an alternative embodiment, the collector contact 40 may be formed in conjunction with the emitter 36 from different sections of the same semiconductor layer. To that end, an additional opening is formed in the conformal layer 34 adjacent to the gate structure 28 when the opening for the growth of the emitter 36 is formed between gate structure 28 and gate structure 30. The collector contact 40 is formed by epitaxial growth on the doped section 22, and is not formed when the emitter contact 42 is formed. Processing continues as described in connection with FIGS. 4-6 to form the bipolar junction transistor 50.

Figure 10:
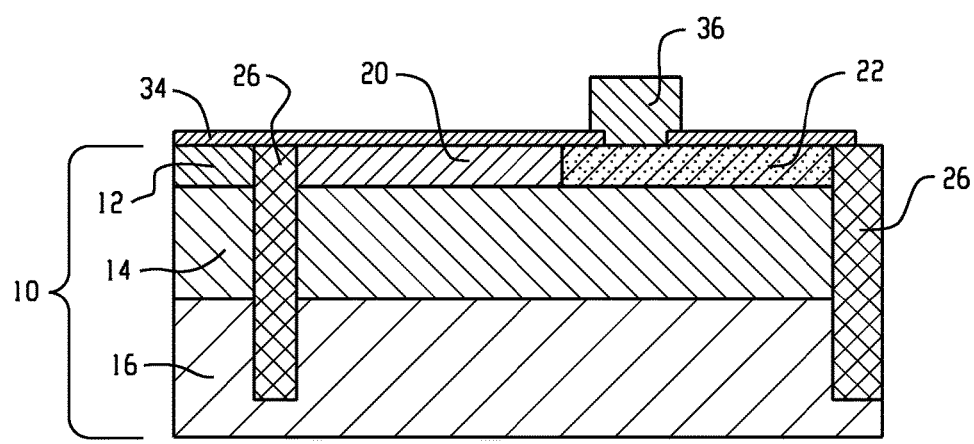
FIGS. 10-12 are cross-sectional views of a portion of a substrate at successive fabrication stages of a processing method for fabricating a device structure in accordance with embodiments of the invention.

With reference to FIG. 10 in which like reference numerals refer to like features in FIG. 3 and in accordance with an alternative embodiment, the emitter 36, emitter contact 42, collector contact 40, and base contact 46 may be formed without utilizing the gate structures 28, 30. In this embodiment, the gate structure 28, 30 are omitted such that their vertical constraint on epitaxial grow is eliminated. The emitter 36 is formed as a semiconductor layer by epitaxial growth on the surface of the section 22 of active device region 18 exposed by the opening in the conformal layer 34, as described in the context of FIG. 3. Due to the absence of lateral constraint, the emitter 36 laterally overgrows the top surface of the conformal layer 34 adjacent to the growth opening in the conformal layer 34.

Figure 11:
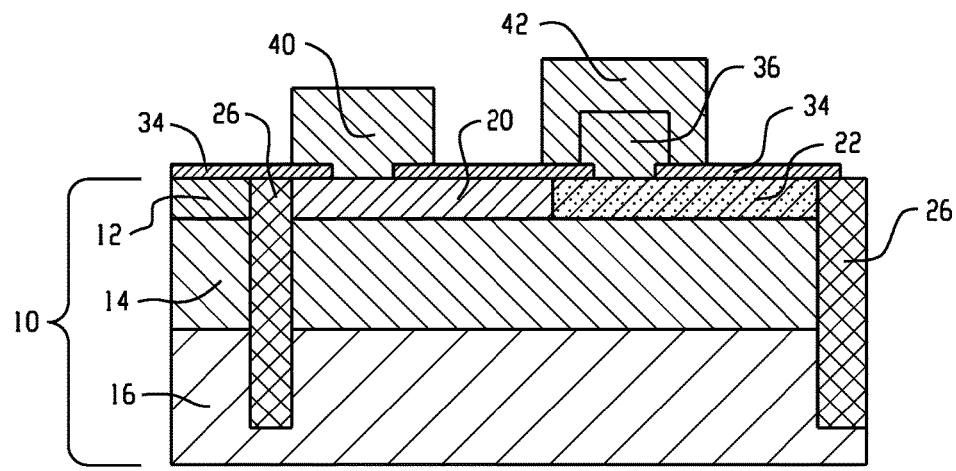

With reference to FIG. 11 in which like reference numerals refer to like features in FIG. 10 and at a subsequent fabrication stage, the emitter contact 42 and collector contact 40 are formed as described in the context of FIG. 4. The collector contact 40 is formed as a semiconductor layer by epitaxial growth on the surface of the section 20 of the active device region 18 in a growth opening defined in the conformal layer 34. The emitter contact 42 is formed as a semiconductor layer by epitaxial growth on the exterior surfaces of emitter 36 such that, after the emitter contact 42 is formed, the emitter 36 is embedded within the emitter contact 42. Due to the absence of lateral constraint, the collector contact 40 and emitter contact 42 each laterally overgrow the top surface of the conformal layer 34.

Figure 12:
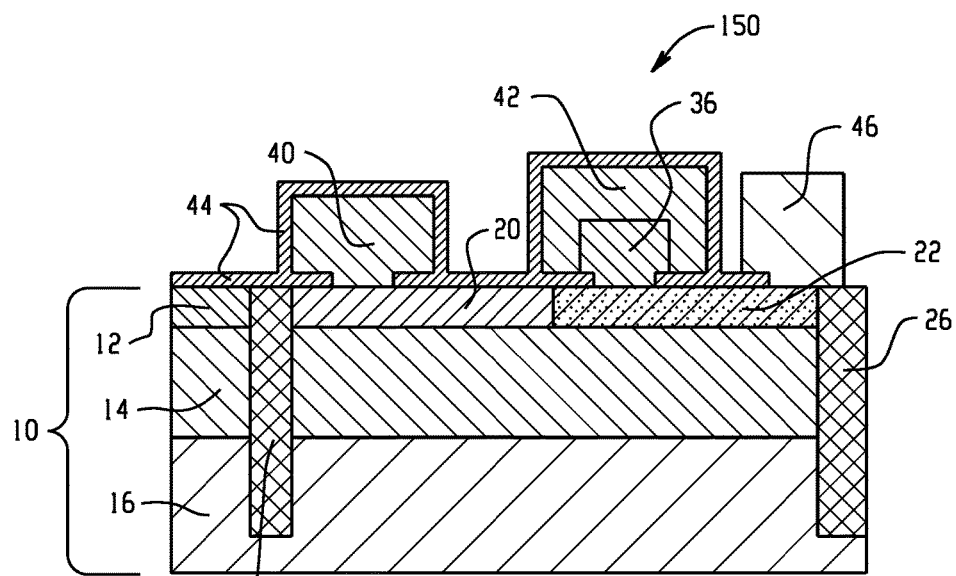

With reference to FIG. 12 in which like reference numerals refer to like features in FIG. 11 and at a subsequent fabrication stage, the base contact 46 is formed on the doped section 22 at a location opened in the conformal layer 44 in order to complete the fabrication of a device structure for a bipolar junction transistor 150 similar to bipolar junction transistor 50 (FIG. 7). The emitter 36 and emitter contact 42 are located laterally between the collector contact 40 and the base contact 46. Due to the absence of lateral constraint, the base contact 46 laterally overgrows the top surface of the conformal layer 44.

Processing continues as described in the contact of FIG. 7 with silicidation to add silicide layer 48 on the collector contact 40, the emitter contact 42, and the base contact 46 and with MOL processing, and BEOL processing.

Figure 13:
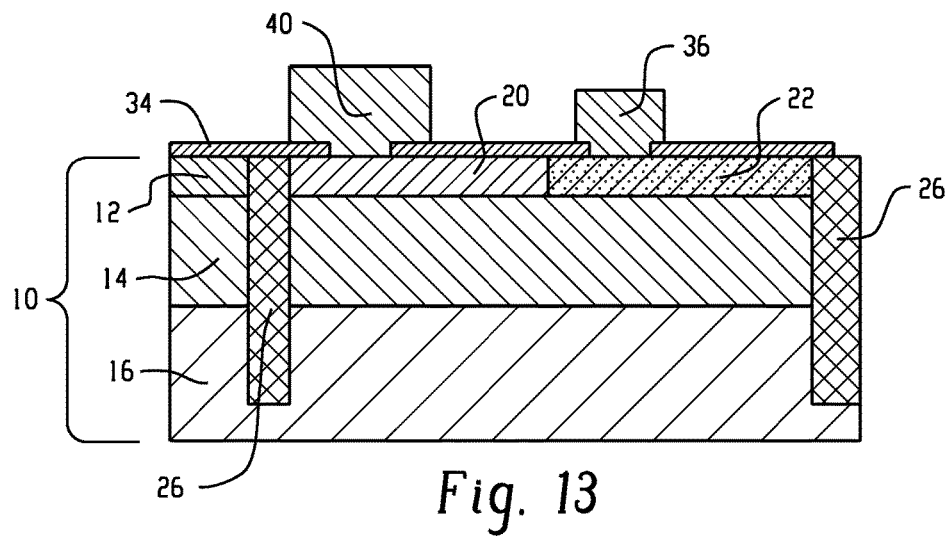
FIG. 13 is a cross-sectional view similar to FIG. 10 of a device structure fabricated by a processing method in accordance with embodiments of the invention.

With reference to FIG. 13 in which like reference numerals refer to like features in FIG. 10 and in accordance with an alternative embodiment, the collector contact 40 may be formed in conjunction with the emitter 36 from different sections of the same epitaxially-grown semiconductor layer. To that end, an additional opening is formed in the conformal layer 34 when the opening for the growth of the emitter 36 is formed in the conformal layer 34. The collector contact 40 is formed by epitaxial growth on the doped section 22, and is not formed when the emitter contact 42 is formed. Processing continues as described in connection with FIGS. 11-12 to form the bipolar junction transistor 50.

Epitaxial overgrowth and lithography limitations determine the spacing between the collector contact 40 and the emitter 36 and emitter contact 42, which determines the transit delay and breakdown voltage. Epitaxial overgrowth and lithography limitations also determine the spacing between the base contact 46 and the emitter 36 and emitter contact 42, which determines the base resistance factoring into the maximum oscillation frequency fmax and the noise figure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
   an intrinsic base;
   an emitter having a vertical arrangement relative to the intrinsic base;
   a collector having a lateral arrangement relative to the intrinsic base;
   a collector contact coupled with the collector; and
   a base contact coupled with the intrinsic base,
   wherein the emitter is laterally arranged between the base contact and the collector contact.

2. The device structure of claim 1 wherein the emitter is comprised of silicon and the intrinsic base is comprised of silicon-germanium.

3. The device structure of claim 1 wherein the intrinsic base is formed from a first section of a device layer of a silicon-on-insulator substrate.

4. The device structure of claim 3 wherein the collector is formed from a second section of the device layer of the silicon-on-insulator substrate, and the second section of the device layer and the first section of the device layer have the lateral arrangement.

5. The device structure of claim 1 wherein the emitter has a top surface and a bottom surface coupled with the intrinsic base, and further comprising:
   an emitter contact coupled with the top surface of the emitter.

6. The device structure of claim 5 wherein the collector contact and the emitter contact have different elevations relative to a plane containing the intrinsic base.

7. The device structure of claim 5 wherein the collector contact and the emitter contact are laterally spaced by a given distance to establish a predetermined breakdown voltage for the device structure.

8. The device structure of claim 7 further comprising:
   a gate structure arranged laterally between the emitter and the collector contact, the gate structure having a gate length,
   wherein the given distance is correlated with the gate length of the gate structure.

9. The device structure of claim 1 further comprising:
   a first gate structure arranged laterally between the emitter and the collector contact.

10. The device structure of claim 9 further comprising:
    a second gate structure arranged laterally between the emitter and the base contact.

11. The device structure of claim 1 further comprising:
    a gate structure arranged laterally between the emitter and the base contact.

12. The device structure of claim 1 wherein the collector and the intrinsic base are vertically arranged to have a contacting relationship with a buried oxide layer of a silicon-on-insulator substrate.

13. The device structure of claim 1 wherein the base contact is comprised of a first semiconductor material.

14. The device structure of claim 13 wherein the collector contact is comprised of a second semiconductor material.

15. The device structure of claim 14 wherein the first semiconductor material has a first conductivity type, and the second semiconductor material has a second conductivity type that is opposite to the first conductivity type.

16. The device structure of claim 1 wherein the base contact is comprised of silicon-germanium.

* * * * *